United States Patent
Taravade et al.

(10) Patent No.: US 8,015,540 B2
(45) Date of Patent: Sep. 6, 2011

(54) METHOD AND SYSTEM FOR REDUCING INTER-LAYER CAPACITANCE IN INTEGRATED CIRCUITS

(75) Inventors: Kunal N. Taravade, Portland, OR (US); Neal Callan, Lake Oswego, OR (US); Paul G. Filseth, Los Gatos, CA (US)

(73) Assignee: LSI Corporation, Milpitas, CA (US)

( * ) Notice: Subject to any disclaimer, the term of this patent is extended or adjusted under 35 U.S.C. 154(b) by 644 days.

(21) Appl. No.: 12/156,281

(22) Filed: May 30, 2008

(65) Prior Publication Data

US 2008/0235643 A1 Sep. 25, 2008

Related U.S. Application Data

(62) Division of application No. 10/991,107, filed on Nov. 17, 2004, now Pat. No. 7,396,760.

(51) Int. Cl.
G06F 17/50 (2006.01)
(52) U.S. Cl. ........... 716/139; 716/55; 716/119; 716/132
(58) Field of Classification Search .................... 716/55, 716/119, 132, 139
See application file for complete search history.

(56) References Cited

U.S. PATENT DOCUMENTS

| | | | |
|---|---|---|---|
| 5,763,955 A | 6/1998 | Findley et al. | 257/775 |
| 6,751,785 B1 | 6/2004 | Oh | 716/10 |
| 6,998,653 B2 | 2/2006 | Higuchi | 257/758 |
| 7,015,582 B2 | 3/2006 | Landis | 428/623 |
| 7,089,522 B2 | 8/2006 | Tan et al. | 716/11 |
| 7,152,215 B2 | 12/2006 | Smith et al. | 716/4 |
| 7,188,321 B2 | 3/2007 | Wong et al. | 716/2 |
| 2002/0190382 A1 | 12/2002 | Kouno et al. | 257/758 |
| 2003/0229479 A1* | 12/2003 | Smith et al. | 703/14 |
| 2005/0186751 A1 | 8/2005 | Beach et al. | 438/384 |

OTHER PUBLICATIONS

Hierarchical Dummy Fill for Process Uniformity; Yu Chen, Andrew B. Kahng, Gabriel Robins and Alexander Zelikovsky; Computer Science Department, UCLA, Los Angeles, CA 90095-1596; UCSD CSE and ECE Departments, La Jolla, CA 92093-0114; Department of Computer Science, University of Virginia, Charlottesville, VA 22903-2442; Department of Computer Science, Georgia State University, Atlanta, GA 30303.
Using Smart Dummy Fill and Selective Reverse Etchback for Pattern Density Equalization; Brian Lee, Duane S. Boning, Dale L. Hetherington and David J. Stein; Massachusetts Institute of Technology, Cambridge, MA, Sandia National Laboratories, Albuquerque, NM; Mar. 2000.

* cited by examiner

*Primary Examiner* — Thuan Do
(74) *Attorney, Agent, or Firm* — Suiter Swantz pc llo

(57) ABSTRACT

The present invention is directed to a method and system of intelligent dummy filling placement to reduce inter-layer capacitance caused by overlaps of dummy filling area on successive layers. The method and system treats each consecutive pair of layers together so as to minimize dummy filling overlaps between each layer. In particular, dummy fill features on each layer may be placed in a checkerboard pattern to avoid overlaps. As such, the present invention may eliminate large overlap area of the dummy patterns on consecutive layers by utilizing intelligent dummy filling placement.

6 Claims, 5 Drawing Sheets

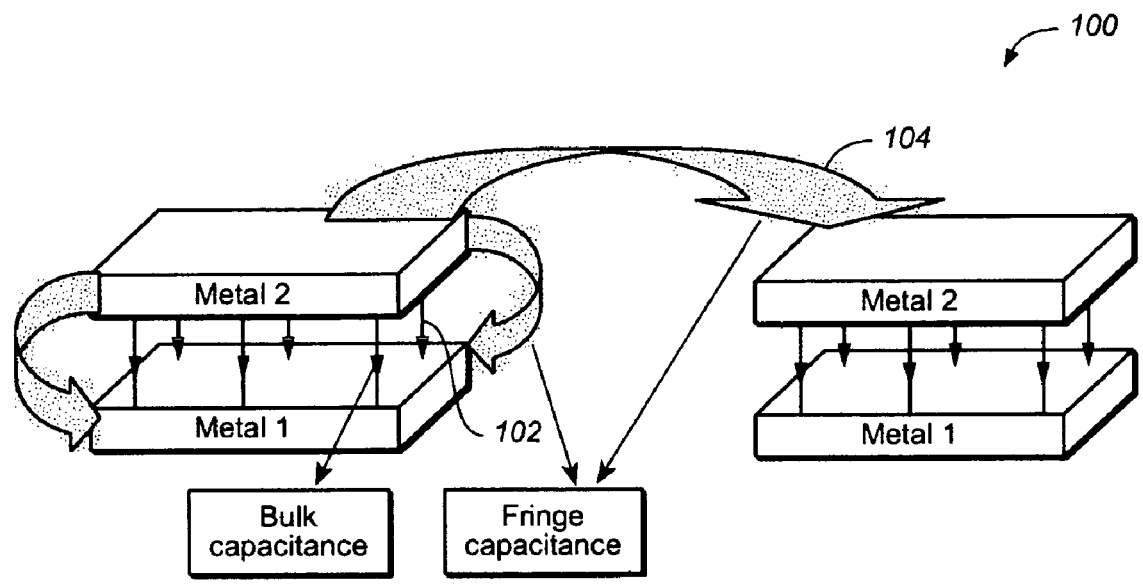
FIG._1
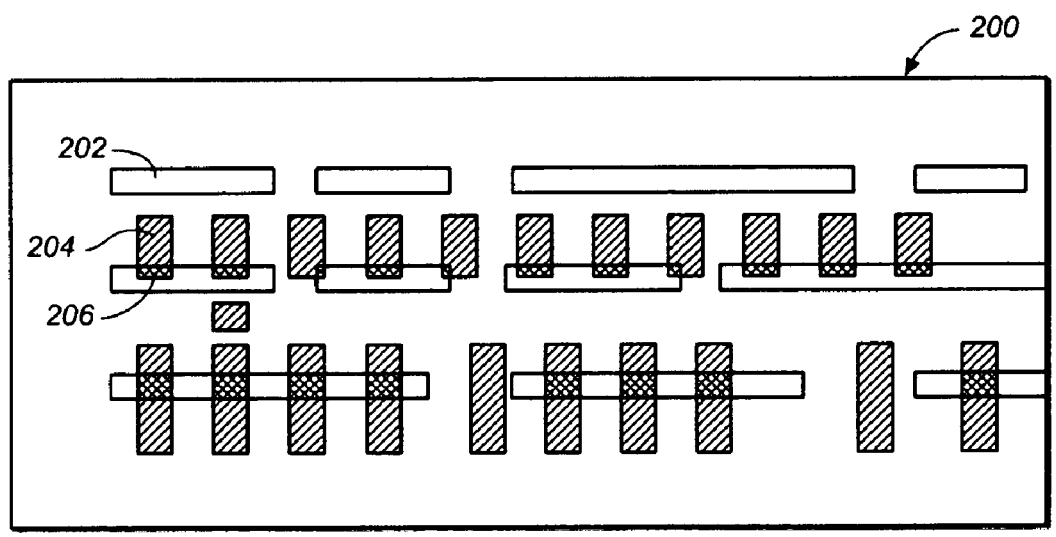
FIG._2

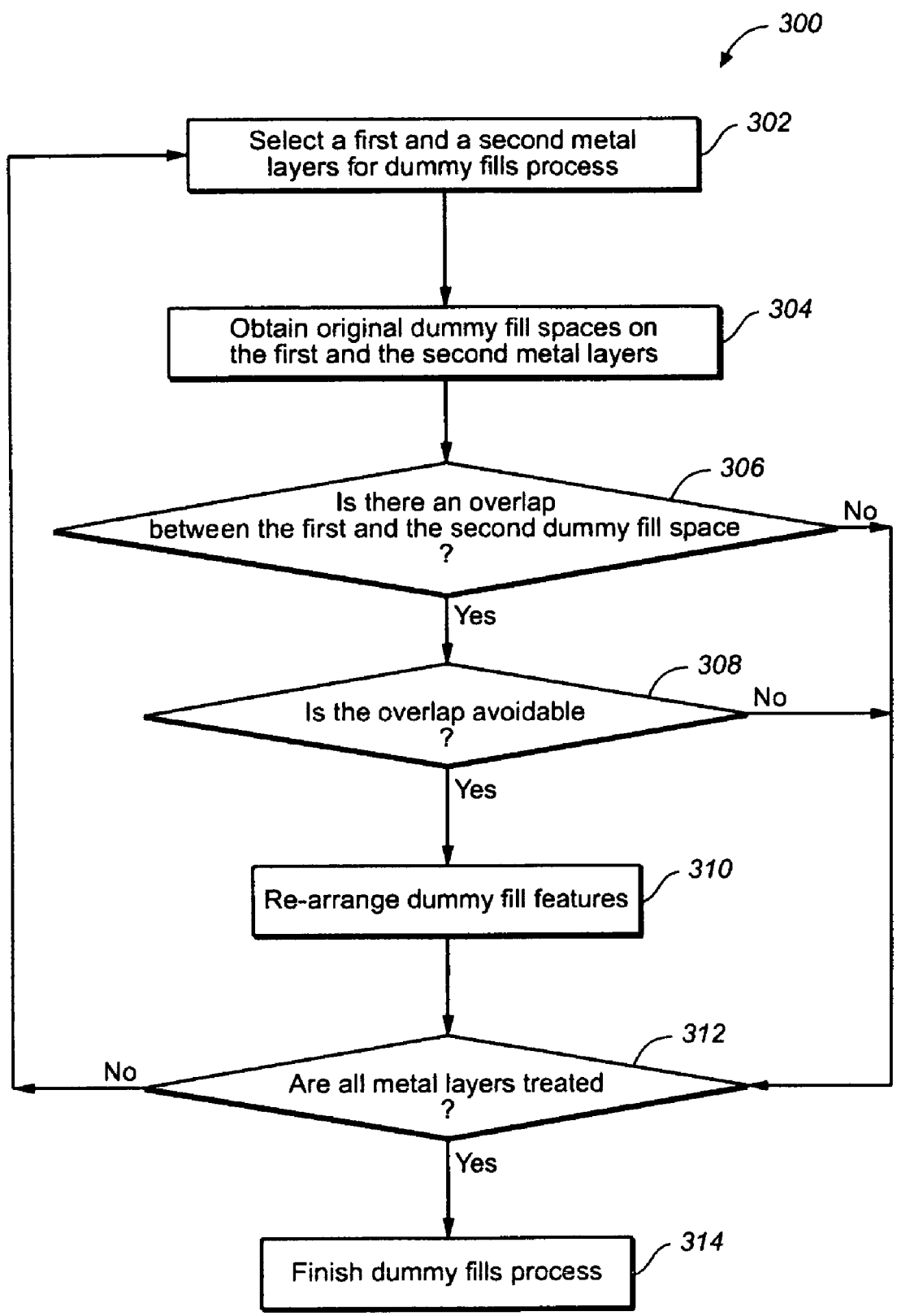
FIG._3

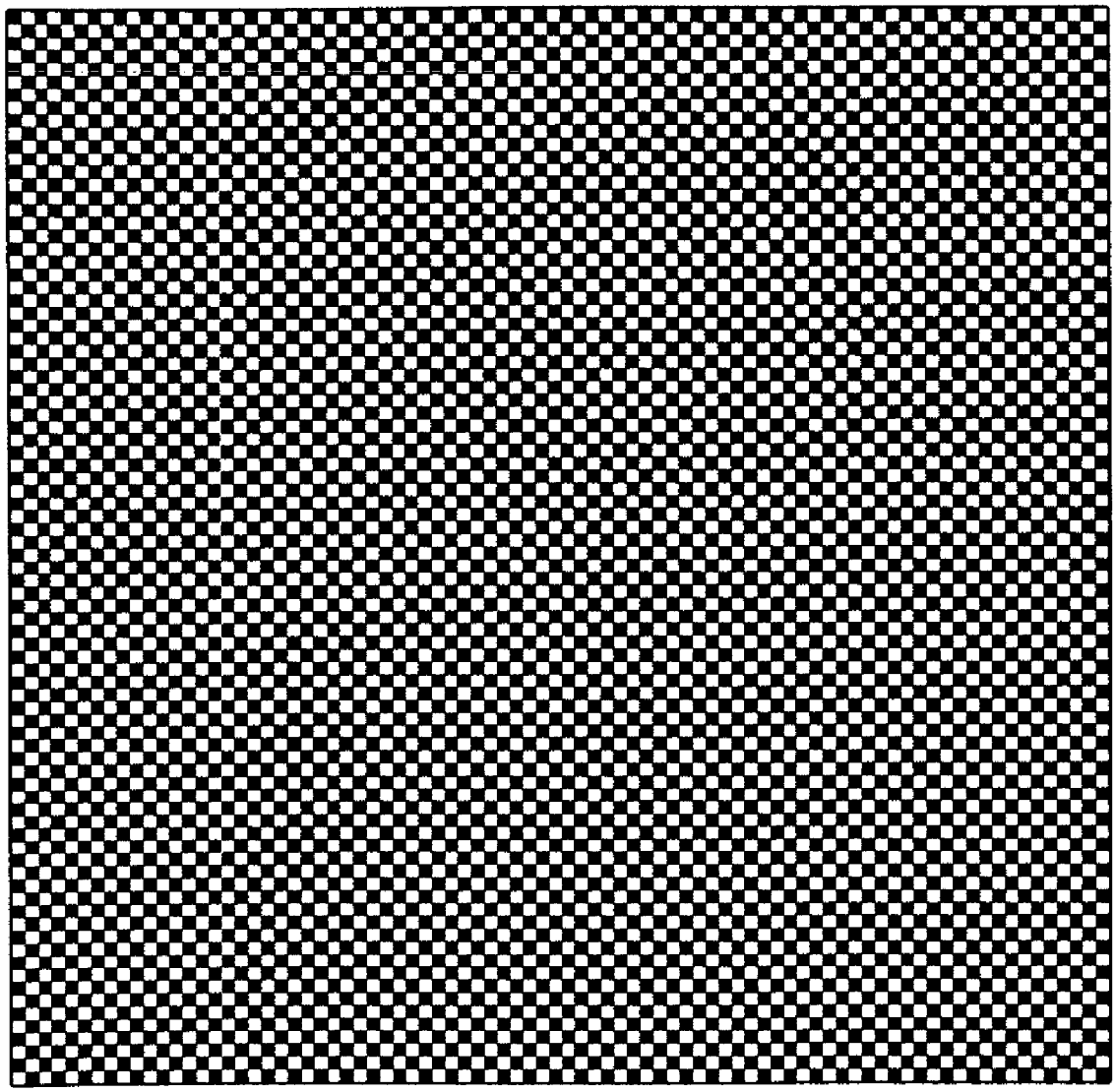
FIG._4

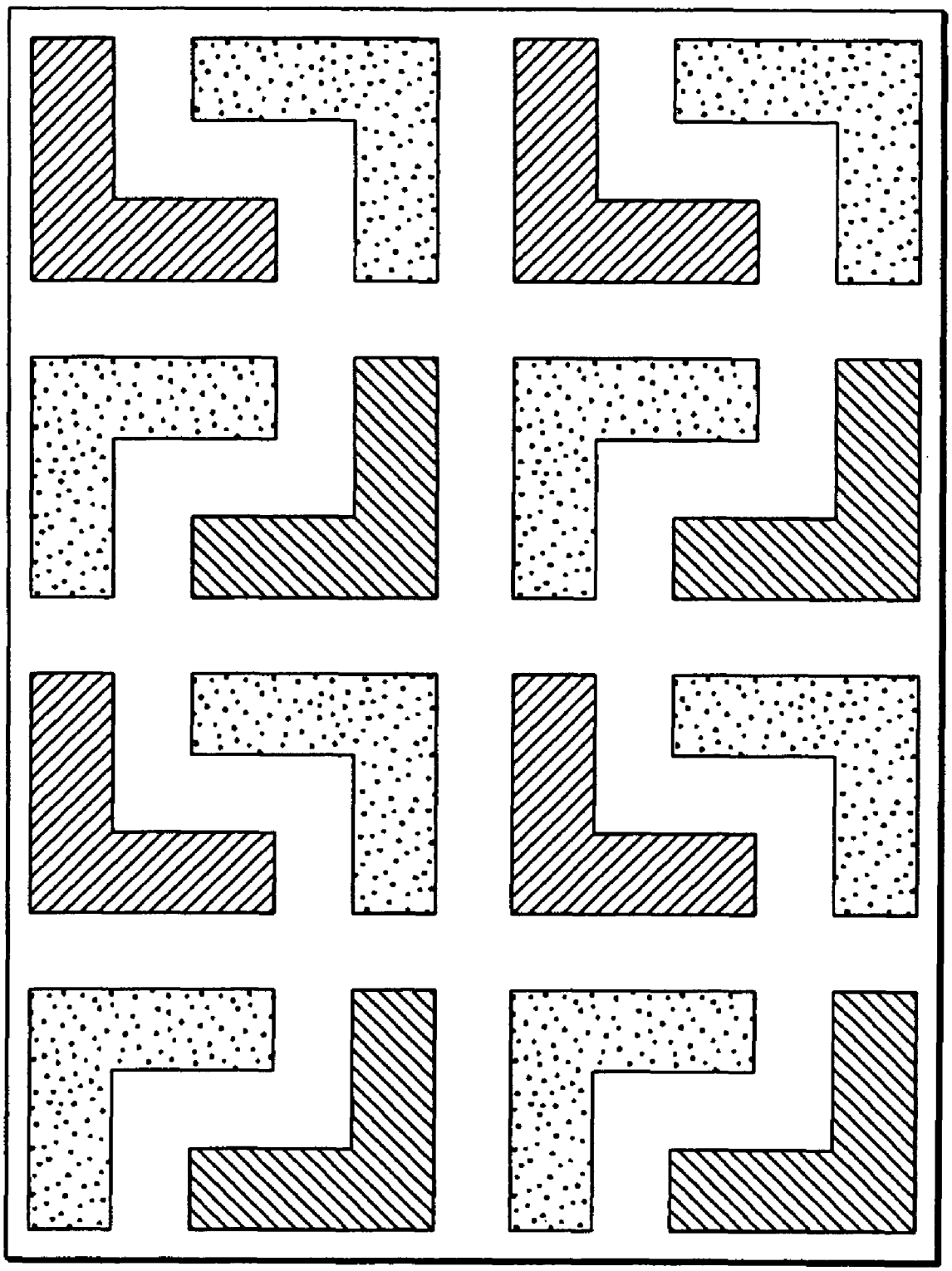
FIG._5

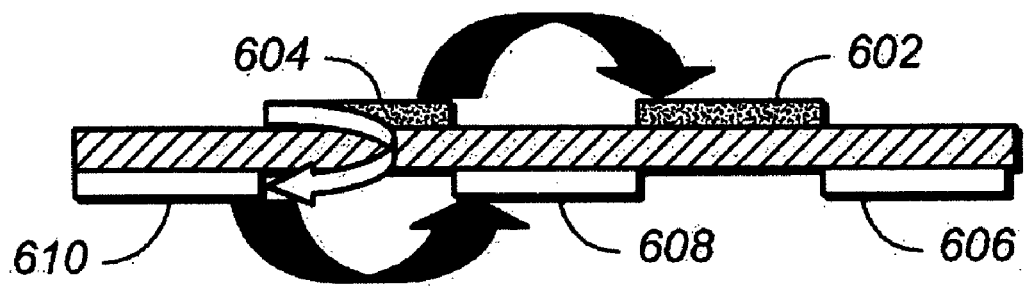
FIG._6

METHOD AND SYSTEM FOR REDUCING INTER-LAYER CAPACITANCE IN INTEGRATED CIRCUITS

CROSS-REFERENCE TO RELATED DOCUMENTS

The present application is a divisional application of U.S. patent application Ser. No. 10/991,107 filed on Nov. 17, 2004, now U.S. Pat. No. 7,396,760. Said U.S. patent application Ser. No. 10/991,107 is hereby incorporated by reference in its entirety.

FIELD OF THE INVENTION

The present invention generally relates to the field of integrated circuit fabrication, and particularly to a method for reducing inter-layer capacitance through dummy fill methodology.

BACKGROUND OF THE INVENTION

In any integrated circuit, there is an inevitable capacitance that is introduced from electromagnetic interaction between electrical conductors, such as interconnect layers (metals). There are two components of such capacitance, a bulk (area) component and a fringe (peripheral) component. The bulk component is proportional to the overlap area of interconnect layers and the fringe component depends on the separation and the perimeter of adjacent interconnect layers. Referring now to FIG. 1, the bulk capacitance 102 and the fringe capacitance 104 between Metal 1 and Metal 2 of an exemplary integrated circuit 100 are shown. The bulk capacitance generated due to the overlap of signal carrying lines on Metal 1 and Metal 2 may not be easily avoided since the placement of signal carrying lines is dictated by circuit functionality. However, the bulk capacitance introduced due to the overlap of non-signal carry lines may be reduced by changing the placement of non-signal carry lines.

An example of non-signal carry lines includes "dummy" fills which are utilized to even the topography and pattern density across the chip, prevent etch, or the like. "Dummy" fills refer to additional features to an integrated chip layout. In a typical integrated chip layout, there are unused areas on a layer after the signal, power and clock segments have been routed. These unused areas can be large enough such that additional features (metals) should be added to satisfy minimum metal coverage requirements for manufacturing. The "dummy" fills may be added to the unused areas such that subsequent layers on the integrated circuit are substantially planar.

For example, a dummy fills methodology is utilized in chemical mechanical polishing or planarization (CMP) process. Often, the planer profile resulting from the CMP process is dependent on the pattern density of the underlying layer. The density may vary and thus result in CMP planer profile variation. Such CMP planer profile variation may be reduced by employing the dummy fills methodology. In particular, dummy fills (dummy features) are inserted into a wafer prior to the CMP process so as to make the pattern density more uniform in IC chips. Uniform feature density improves wafer-processing uniformity for certain operations such as CMP. Dummy fills are typically placed according to conventional dummy fills methodologies that locate dummy fills where space is available. However, the conventional dummy fills methodologies allow a large planer profile variation. Some sophisticated dummy fills methodologies are utilized to reduce the large planer profile variation by selectively inserting dummy fills to achieve an effective density to within a predetermined range.

While most dummy fills methodologies have focused on uniform feature density, the problems created by the inserted dummy fills such as adverse effects on the electric field, unwanted bulk capacitance, and the like have not been addressed. Further, the existing dummy fill methodologies treat each layer independently which results in a large overlap over dummy fill areas on successive layers. Referring now to FIG. 2, the overlaps 206 between Metal 1 dummy fill area 202 and Metal 2 dummy fill area 204 are shown. If the overlaps 206 are large, the unwanted bulk capacitance may be increased, thereby slowing down signals in the circuit and adversely affecting timing.

Therefore, it would be desirable to provide a method and system of intelligent dummy fill placement to reduce inter-layer capacitance caused by overlaps of dummy fill area on successive layers. It would be also desirable to provide a method and system for treating each consecutive pair of layers together when the intelligent dummy filling placement is performed.

SUMMARY OF THE INVENTION

Accordingly, the present invention provides a method and system for reducing inter-layer capacitance utilizing an intelligent dummy filling placement in integrated circuits.

In a first aspect of the present invention, a system for locating dummy fill features in an integrated circuit fabrication process is provided. The system may comprise an input for obtaining circuit layout information which provides initial signal lines on layers of the integrated circuit. The system may treat each successive pair of layers (a first layer and a second layer) together. The system may comprise a means for defining dummy fill features including small squares within the dummy fill space. The dummy fill spaces are suitable to have dummy fill features inserted. The dummy fill spaces may include areas where dummy patterns are intended to be placed on the first layer and the second layer. Then, the system may assign alternating dummy fill features to each layer in order to avoid overlaps between dummy fill features on each layer.

In a second aspect of the present invention, a method of placing dummy fill patterns to minimize inter-layer capacitance in an integrated circuit fabrication process is provided. The integrated circuit may include many interconnect layers (metals). The method may treat each consecutive pair of layers (a first layer and a second layer) together. Layout information of the integrated circuit may be obtained to determine an initial dummy fill space for a first layer and a second layer. Whether there are overlaps between the initial dummy fill space on the first layer and the initial dummy fill space on the second dummy fill space may be determined. If the overlaps are found and avoidable by re-arranging dummy fill patterns, a first dummy fill pattern and a second dummy fill pattern may be re-arranged to minimize the overlaps.

Additionally, the first dummy fill pattern may be placed to form a checkerboard pattern. If the first layer is already arranged in the form of a checkerboard pattern, the first dummy fill pattern may not be re-arranged. Then, the second dummy fill pattern may be placed to form a checkerboard pattern so as to be offset from the first dummy fill pattern. In this manner, each of the dummy fill features on the first layer may not be placed directly above dummy fill features on the second layer. Consequently, the unwanted bulk capacitance introduce by the dummy fill may be reduced and thus the inter-layer capacitance is minimized.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an illustration of fringe and bulk capacitance components in an exemplary integrated circuit having Metal 1 and Metal 2 layers;

FIG. 2 is an illustration of layout image showing overlaps of dummy fill areas of Metal 1 and Metal 2 layers in FIG. 1;

FIG. 3 is a flow diagram illustrating a method implemented in accordance with an exemplary embodiment of the present invention wherein two consecutive layers are treated;

FIG. 4 is a top view of a layer showing a checkerboard pattern formed by the method described in FIG. 3;

FIG. 5 is a top view of two layers showing an alternative pattern with which the present invention can be embodied; and FIG. 6 is a cross-sectional view of two layers showing offset dummy fill features inserted by the method described in FIG. 3.

DETAILED DESCRIPTION OF THE INVENTION

Reference will now be made in detail to the presently preferred embodiments of the invention, examples of which are illustrated in the accompanying drawings.

Referring generally now to FIGS. 3 through 5, exemplary embodiments of the present invention are shown.

The present invention is directed to a method and system of intelligent dummy filling placement to reduce inter-layer capacitance caused by overlaps of dummy fills on successive layers. Generally, dummy fill refers to the addition of features to a layout for the purpose of raising the density of specific regions on the layout of the integrated circuit. The method and system treats each consecutive pair of layers together so as to minimize the overlaps of dummy fills between each layer. In particular, dummy fill features on each layer may be placed in a checkerboard pattern to avoid overlaps. As such, the present invention may eliminate large overlap areas of the dummy fills on consecutive layers by utilizing intelligent dummy fill placement. In the following description, numerous specific descriptions are set forth in order to provide a thorough understanding of the present invention. It should be appreciated by those skilled in the art that the present invention may be practiced without some or all of these specific details. In some instances, well known process operations have not been described in detail in order to prevent obscurity of the present invention.

Referring now to FIG. 3, a flow diagram 300 illustrating a method implemented in accordance with an exemplary embodiment of the present invention wherein a dummy fill process is performed on each layer of an integrated circuit is shown. Generally, an integrated circuit fabrication process involves a series of layering processes in which metallization, dielectrics, and other materials are applied to the surface of a semiconductor wafer to form a layered interconnected structure (an interconnect layer). The integrated circuits generally include inter-layered circuits comprising a plurality of metal lines across multiple layers that are interconnected by metal-filled vias. The method begins in step 302 in which a first layer and a second layer are selected for dummy fill process. The first layer and the second layer are a consecutive pair of layers of the IC.

Generally, dummy fills are utilized to improve planer profile uniformity by helping to level the feature density across the layout during an integrated circuit fabrication process. For example, dummy fills are utilized in chemical mechanical polishing or planarization (CMP) process. Often, the planer profile resulting from the CMP process is dependent on the pattern density of the underlying layer. The dependency may vary and thus offset the CMP planer profile variation. Such variation may be reduced by employing the dummy fills methodology. In particular, dummy fills (dummy features) are inserted into a wafer prior to the CMP process so as to make the pattern density more uniform in IC chips. Uniform feature density improves wafer-processing uniformity for certain operations such as CMP. Placement of the dummy fills is typically made according to conventional dummy fill methodologies that locate the uniform-densities dummy where space is available. However, the inserted dummy fills may create problems such as adverse effects on the electric field, unwanted bulk capacitance, and the like.

In Step 304, the original (initial) dummy fill spaces of the first layer and the second layer may be obtained based on layout information. The layout information may be provided by a user, an IC fabrication process system, a CAD tool, or the like. The original dummy fill space may include areas where dummy fill patterns are intended to be placed on layers. Then, in Step 306, whether there is any overlap between the original dummy fill space of the first layer and the original dummy fill space of the second layer may be determined. The overlaps of dummy fill areas between the first layer and the second layer are undesirable since the unwanted bulk capacitance may be introduced by the overlaps. Thus, in step 308, whether the overlap can be avoided by re-arrangement of dummy features may be checked. Then, dummy fill patterns on the first layer and the second layer may be re-arranged to minimize the overlaps in Step 310. In a particular embodiment of the present invention, a grid (composed of small squares) may be defined within the dummy fill spaces. The method may assign alternating squares (dummy fill features) in the grid to each layer. In this manner, dummy fill features on the first layer are not placed directly above the ones on the second layer but offset from each other. It is to be noted that the dummy fill features may be placed to form various predefined patterns designed to prevent overlaps on adjacent layers. Referring now to FIG. 4, an exemplary top view of a layer showing a checkerboard pattern formed by the present invention is shown. As shown in FIG. 4, dummy fill features placed in a checkerboard pattern may avoid overlap, thereby reducing the bulk capacitance component of the total capacitance. Preferably, the dummy fill features are placed to form a checkerboard pattern. Referring now to FIG. 5, an exemplary top view of two layers showing a different pattern with which the present invention can be embodied is shown.

Referring back to FIG. 3, if there is no overlap found, the method may proceed to check whether all interconnect layers in the IC have been treated in Step 312. If all interconnect layers have been treated, the method may finish the dummy fill pattern placement in step 314. If all interconnect layers have not been treated, the method may proceed to step 302 by selecting the next pair of consecutive layers.

Additionally, the method may check whether the first layer is already arranged in the form of a checkerboard. If the first layer includes dummy fill pattern in the form of a checkerboard, the dummy fill pattern on first layer may not be re-arranged. The dummy fill pattern on the second layer may be re-arranged to form a checked board pattern by offsetting against the dummy fill pattern on the first layer.

One of skill in the art will appreciate that there are various ways to check the form of the dummy fill pattern. In a particular embodiment, numbers may be assigned to dummy features in order to check whether the dummy fill pattern is already in the form of a checkerboard pattern. For example, a dummy feature may have a row number, a column number, and a layer number. The dummy fill pattern may be checked by implementation of a simple Boolean check as follows: Pattern checking number=row number+column number+layer number. Each dummy feature may have a pattern checking number. The numbering scheme for the simple Boolean check may be assigned such that the pattern checking number is always odd for given row number, column number and layer number. As such, the dummy fill features on the first layer and the second layer are placed on alternating row and column combinations. Additionally, the simple Boolean check may be utilized to determine whether to re-arrange dummy features on the layer.

In FIG. 6, a cross-sectional view 600 of two layers showing offset dummy fill features inserted by the present invention is shown. The first dummy features 602, 604 is arranged to offset the second dummy features 606-610. The checkerboard style layout of the dummy fill pattern prevents situations in which dummy patterns on successive layers overlap, thereby increasing parasitic capacitance of the circuit by adding bulk (area) capacitance of the chip in proportion to the overlap area of the dummy patterns on consecutive layers. By offsetting the dummy patterns in a checkerboard fashion, the large bulk capacitance component may be eliminated. As a result, the total capacitance for an integrated circuit may be reduced.

Generally, the total capacitance for an integrated circuit composed of interconnect layers (metals) may be given by:

$$C_{TOTAL}=C_{BULK}+C_{FRINGE}$$

where $C_{BULK}$=Bulk intra-layer capacitance (bulk capacitance of metal lines on the same layer)+Bulk inter-layer Capacitance (bulk capacitance of metal lines on adjacent layers) and $C_{FRINGE}$=Fringe intra-layer capacitance (fringe capacitance of metal lines on the same layer)+Fringe inter-layer Capacitance (fringe capacitance of metal lines on adjacent layers).

In a particular embodiment of the present invention, the above-described method and system may be implemented through various commercially available polygon manipulation languages. An example of the commercially available polygon manipulation languages may include, but are not limited to, Mentor Graphics® Calibre®, Synopsys® Hercules® or the like.

It should be noted that the method and system of the present invention may be utilized for wafer processing operations such as CMP. However, the method and the system of the present invention may be utilized for any suitable integrated circuit fabrication process.

In the exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not necessarily meant to be limited to the specific order or hierarchy presented.

It is believed that the method and system of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system for intelligent placement of dummy fill patterns in an integrated circuit fabrication process, comprising:
   means for obtaining layout information of the integrated circuit, the integrated circuit including a plurality of layers;
   means for selecting a first layer and a second layer, wherein the second layer is placed successively to the first layer;
   means for obtaining initial layouts of metal lines on the first layer and the second layer;
   means for determining a first dummy fill space based on the initial layout on the first layer, the first dummy fill space suitable for including a plurality of dummy fill features on the first layer;
   means for determining a second dummy fill space based on the initial layout on the second layer, the second dummy fill space suitable for including a plurality of dummy fill features on the second layer;
   means for determining an overlap between the first dummy fill space and the second dummy fill space; and
   means for minimizing the overlap by arranging the plurality of first dummy fill features and the plurality of second dummy fill features,
   wherein the integrated circuit includes the first layer and the second layer.

2. The system as described in claim 1, the means for minimizing the overlap further comprising:
   means for determining whether a dummy fill pattern of the first layer is a checkerboard pattern; and
   means for placing the plurality of first dummy fill features to form the checkerboard pattern if the dummy fill pattern of the first layer is not arranged in the checkerboard pattern.

3. The system as described in claim 1, further comprising:
   means for placing the plurality of second dummy fill features based on the dummy fill pattern of the first layer if the dummy fill pattern of the first layer is already the checkerboard pattern.

4. The system as described in claim 3, wherein the plurality of second dummy fill features are placed so as to form an alternate checkerboard pattern against the checkerboard pattern of the plurality of first dummy fill features.

5. The system as described in claim 3, wherein the plurality of second dummy fill features are placed so as to be offset from the plurality of first dummy fill features.

6. The system as described in claim 1, wherein a total bulk capacitance of the integrated circuit is minimized.

* * * * *